(12) United States Patent
Kim et al.

(10) Patent No.: US 6,657,270 B2
(45) Date of Patent: Dec. 2, 2003

(54) MAGNETIC RANDOM ACCESS MEMORY USING BIPOLAR JUNCTION TRANSISTOR, AND METHOD FOR FABRICATING THE SAME

(75) Inventors: Chang Shuk Kim, Kyoungki-do (KR); Hee Bok Kang, Daejeon Metropolitan (KR); Sun Ghil Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/127,364

(22) Filed: Apr. 22, 2002

(65) Prior Publication Data

US 2002/0175386 A1 Nov. 28, 2002

(30) Foreign Application Priority Data

May 22, 2001 (KR) .......................................... 2001-28132

(51) Int. Cl.[7] .............................................. H01L 29/82
(52) U.S. Cl. ...................... 257/423; 257/423; 257/273
(58) Field of Search .......................... 257/423, 28, 295; 438/3; 365/230.07, 158

(56) References Cited

U.S. PATENT DOCUMENTS

| | | | | |
|---|---|---|---|---|
| 5,389,566 A | * | 2/1995 | Lage | 438/3 |
| 5,793,697 A | * | 8/1998 | Scheuerlein | 365/230.07 |
| 6,211,531 B1 | * | 4/2001 | Nakazato et al. | 257/28 |
| 6,341,084 B2 | * | 1/2002 | Numata et al. | 365/158 |
| 6,413,788 B1 | * | 7/2002 | Tuttle | 438/3 |

* cited by examiner

*Primary Examiner*—David Nelms
*Assistant Examiner*—Thinh T. Nguyen
(74) *Attorney, Agent, or Firm*—Marshall, Gerstein & Borun LLP

(57) ABSTRACT

A magnetic random access memory (MRAM) is disclosed. The MRAM may include a semiconductor substrate serving as a base of a bipolar junction transistor; an emitter and a collector of the bipolar junction transistor provided at an active region of the semiconductor substrate; an MTJ cell positioned at the active region between the emitter and the collector, separately from the emitter and the collector by a predetermined distance; and a word line provided on the MTJ cell. The MRAM may also include a bit line contacting the collector; and a reference voltage line contacting the emitter. As a result, the constitution and fabrication process of the MRAM are simplified to improve productivity and properties of the device.

7 Claims, 3 Drawing Sheets

MAGNETIC RANDOM ACCESS MEMORY USING BIPOLAR JUNCTION TRANSISTOR, AND METHOD FOR FABRICATING THE SAME

BACKGROUND

1. Technical Field

A magnetic random access memory and a method for fabricating the same are are disclosed, and in particular a technology for fabricating a magnetic random access memory (abbreviated as 'MRAM') having a higher speed than static random access memory (SRAM) devices, an integration density as high as dynamic random access memory (DRAM) devices, and a property of a nonvolatile memory such as a flash memory is disclosed.

2. Description of the Background Art

Most of the semiconductor memory manufacturing companies have developed the MRAM using a ferromagnetic material and regard the MRAM as one of the next generation memory devices.

The MRAM is a memory device for storing and recalling information using multi-layer ferromagnetic thin films, and sensing current variations according to a magnetization direction of the respective thin films. The MRAM has a high operating speed, low power consumption and high integration density due to the special properties of the magnetic thin film. Additionally, the MRAM may be used in nonvolatile memory applications in which flash memory is presently used.

The MRAM uses a giant magneto resistive (abbreviated as 'GMR') phenomenon or a spin-polarized magneto-transmission (SPMT) that is generated when the spin polarization influences electron transmission.

The MRAM using the GMR phenomenon operates based on the fact that resistance varies remarkably when spin directions are different in two magnetic layers having a non-magnetic layer therebetween, which is one way to implement a GMR magnetic memory device.

The MRAM using the SPMT phenomenon operates based on the fact that larger current transmissions are generated when spin directions are identical in two magnetic layers having an insulating layer therebetween, which is one way to implement a magneto-transmission junction memory device.

However, MRAM research is still in its early stage, and is mostly concentrated on the formation of multi-layer magnetic thin films. Less research is in progress on a unit cell structure and a peripheral sensing circuit for MRAM technology.

FIG. 1 is a cross-sectional diagram illustrating a first example of a conventional MRAM.

Referring to FIG. 1, a gate electrode 33, namely a first word line is formed on a semiconductor substrate 31. Here, a gate oxide film 32 is formed on an interface between the gate electrode 33 and the semiconductor substrate 31.

Source/drain junction regions 35a and 35b are formed on the semiconductor substrate 31 at both sides of the first word line 33, and a reference voltage line 37a and a first conductive layer 37b are formed to contact the source/drain junction regions 35a and 35b. Here, the reference voltage line 37a is formed during the formation process of the first conductive layer 37b.

Thereafter, a first interlayer insulating film 39 is formed to planarize the whole surface of the resultant structure, and a first contact plug 41 is formed to expose the first conductive layer 37b.

A second conductive layer, which is a lower read layer 43 contacting the first contact plug 41, is patterned.

A second interlayer insulating film 45, which planarizes the whole surface of the resultant structure, is formed, and a second word line that is a write line 47, is formed on the second interlayer insulating film 45.

A third interlayer insulating film 48, which planarizes the upper portion of the second word line that is the write line 47, is then formed.

A second contact plug 49 is formed to expose the second conductive layer 43.

A seed layer 51 is formed to contact the second contact plug 49. Here, the seed layer 51 is formed to overlap between the upper portion of the second contact plug 49 and the upper portion of the write line 47.

Thereafter, a semi-ferromagnetic layer (not shown), a pinned ferromagnetic layer 55, a tunnel barrier layer 57 and a free ferromagnetic layer 59 are stacked on the seed layer 51, thereby forming a magnetic tunnel junction (MTJ) cell 100 having a pattern size approximately as large as the write line 47 and that overlaps the write line 47.

At this time, the semi-ferromagnetic layer prevents the magnetization direction of the pinned layer from being changed, and the magnetization direction of the pinned ferromagnetic layer 55 is fixed to one direction. The magnetization direction of the free ferromagnetic layer 59 can be changed by generated magnetic field, and information of '0' or '1' can be stored according to the magnetization direction of the free ferromagnetic layer 59.

A fourth interlayer insulating film 60 is formed over the resultant structure, and evenly etched to expose the free ferromagnetic layer 59. An upper read layer, namely a bit line 61, is formed to contact the free ferromagnetic layer 59.

Still referring to FIG. 1, the structure and operation of the MRAM will now be explained.

The unit cell of the MRAM includes one field effect transistor having the first word line as a read line for reading information, the MTJ cell 100 and the second word line 47, which is a write line that determines the magnetization direction of the MTJ cell 100 by forming an external magnetic field by applying current. The MRAM also includes the bit line 61, which is an upper read layer informing the magnetization direction of the free layer, by applying current to the MTJ cell 100 in a vertical direction.

Here, during the operation of reading information from the MTJ cell 100, a voltage is applied to the first word line 33 as the read line, thereby turning the field effect transistor on, and the magnetization direction of the free ferromagnetic layer 59 in the MTJ cell 100 is detected by sensing a magnitude of current applied to the bit line 61.

During the operation of storing the information in the MTJ cell 100, while maintaining the field effect transistor in an off state, the magnetization direction in the free ferromagnetic layer 59 is controlled by a magnetic field generated by applying current to the second word line 47, which is the write line, and the bit line 61.

At this time, when current is applied to the bit line 61 and the write line 47 at the same time, a cell at a vertical intersecting point of the two metal lines can be selected. In addition, the operation of the MTJ cell 100 in the MRAM will now be described.

When the current flows in a vertical direction in the MTJ cell, a tunneling current flows through an insulating film.

When the tunnel barrier layer and the free ferromagnetic layer have the same magnetization direction, the tunneling current increases.

When the tunnel barrier layer and the free ferromagnetic layer have different magnetization directions, the tunneling current decreases. This is referred to as a tunneling magneto resistance (TMR) effect.

A decrease in the magnitude of the current due to the TMR effect is sensed, and thus the magnetization direction of the free ferromagnetic layer is sensed, thereby detecting the information stored in the cell.

FIG. 2 is a cross-sectional diagram illustrating a second example of the conventional MRAM.

As illustrated in FIG. 2, an element isolating film (not shown) defining an active region is formed on a semiconductor substrate 111.

A gate electrode 113 having a gate oxide film 112 is formed on the active region of the semiconductor substrate 111, an insulating film spacer (not shown) is formed at the side walls thereof, and source/drain regions 115a and 115b are formed by implanting impurities to the active region of the semiconductor substrate 111, thereby forming a transistor. Here, the gate oxide film 112 is positioned on an interface between the gate electrode 113 and the semiconductor substrate 111.

The closer the MTJ cell 100 of the MRAM and the gate electrode 113, which is used as the write line, are positioned, the more the magnetic field is increased. Accordingly, an interlayer insulating film is formed in a succeeding process in a reduced thickness.

The gate electrode 113 has a stacked structure of a polysilicon film/metal film, a polysilicon film/metal film/polysilicon film, a polysilicon film/silicide ($CoSi_x$, $TiSi_x$, etc.) film, or a polysilicon film/silicide ($CoSi_x$, $TiSi_x$, etc.) film/polysilicon film in order to smoothly form an insulating material thereon.

Thereafter, a first interlayer insulating film 121, which planarizes the whole surface of the resultant structure, is formed. Here, a reference voltage line 117 contacting the source junction region 115a and a lower read layer 119 contacting the drain junction region 115b are provided.

A second interlayer insulating film 123 is formed on the first interlayer insulating film 121, and a contact plug 125 is formed to contact the lower read layer 119 through the second interlayer insulating film 123.

A seed layer 127 is formed to contact the contact plug 125, namely the lower read layer 119. Here, the seed layer 127 is formed to overlap sufficiently with the first word line 113.

A third interlayer insulating film 129 is formed to expose the seed layer 127.

An MJT cell 137 is formed at the upper portion of the seed layer 127 over the first word line 113.

Here, a stacked structure of a semi-ferromagnetic layer (not shown), a pinned ferromagnetic layer 131, a tunnel barrier layer 133 and a free ferromagnetic layer 135 is formed to contact the seed layer 127, and patterned using an MTJ cell mask, thereby forming the MTJ cell 137.

Thereafter, a fourth interlayer insulating film 139 is formed and planarized to expose the MTJ cell 137, and a bit line contacting the free ferromagnetic layer 135 of the MTJ cell 137, namely an upper read layer 141 is formed, thereby completing formation of the MRAM cell.

The data write operation of the second example of the MRAM will now be described.

First, the magnetization direction of the free ferromagnetic layer 135 is changed by using a magnetic field generated by applying current to the gate electrode, which is the first word line 113, and to the bit line 141. Here, the first word line 113 has a high level, and thus the current flowing through the MTJ cell 137 is discharged to the reference voltage line 117 through the transistor. In order to prevent the foregoing problem, a reference voltage potential is increased by applying a reference voltage to the reference voltage line 117, so that the current flowing through the MTJ cell 137 is not discharged to the reference voltage line 117 through the transistor.

At this time, it is possible to simultaneously apply a Vss reference voltage to the reference voltage line 117 and a Vbs substrate voltage to the semiconductor substrate 111. In addition, the substrate voltage can be applied to the reference voltage line 117, instead of the ground voltage.

As described above, in the conventional MRAM and the method for fabricating the same, because the contact to the bit line is formed through the MTJ cell, the entire fabrication process is complicated, productivity is reduced due to an increased cell area, and thus high integration of the semiconductor device is difficult and is rarely achieved.

SUMMARY

As disclosed, there is provided an MRAM using a bipolar junction transistor that may include a semiconductor substrate, a bit line, a word line, a resistance device having a resistance that varies due to an electric or magnetic signal, and the bipolar junction transistor.

In another aspect of the disclosed device, an MRAM using a bipolar junction transistor may include a semiconductor substrate serving as a base of a bipolar junction transistor; an emitter and a collector of the bipolar junction transistor provided at an active region of the semiconductor substrate; an MTJ cell positioned at the active region between the emitter and the collector, spaced apart from the emitter and the collector by a predetermined distance; a word line provided on the MTJ cell; a bit line contacting the collector; and a reference voltage line contacting the emitter.

In yet another aspect, a method for fabricating an MRAM using a bipolar junction transistor, may include the forming an emitter and a collector at an active region of a semiconductor substrate by an implant process; forming a stacked structure of a pinned ferromagnetic layer, a tunnel barrier layer and a free ferromagnetic layer over the resultant structure; forming an island type MTJ cell by patterning the stacked structure of the pinned ferromagnetic layer, the tunnel barrier layer and the free ferromagnetic layer according to a photolithography process using an MTJ cell mask; and forming a conductive layer for a word line over the resultant structure. The method may also include forming a stacked structure of the MTJ cell and the word line, by patterning the conductive layer for the word line according to a photolithography process using a word line mask; forming a first interlayer insulating film exposing the upper portion of the word line over the resultant structure; forming a connection line and a reference voltage line respectively connected to the emitter and the collector through the first interlayer insulating film; forming a second interlayer insulating film over the resultant structure; and forming a bit line to be connected to the connection line through the second interlayer insulating film.

On the other hand, the principle of the disclosed device and method will now be explained.

The MTJ cell may be formed between the word line and the semiconductor substrate without using a gate oxide film. Here, the MTJ cell is formed at the active region, spaced apart form the source/drain junction regions by a predetermined distance, and the reference voltage line and the bit line are formed to contact the source/drain junction regions. Accordingly, the MTJ cell is used as an input electrode of the bipolar junction transistor using the semiconductor substrate as a base, the drain junction region as a collector electrode, and the source junction region as an emitter electrode.

In the data write process, a required current is simultaneously applied to the word line and the bit line to generate a magnetic field. The magnetic field generates magnetization inversion in the free ferromagnetic layer of the MTJ cell to write data.

In the data read process, not a current but a voltage is applied to the word line. A resistance of the MTJ cell used as the input electrode is varied according to information stored in the MTJ cell. An input signal of the bipolar junction transistor is controlled according to the variations of the resistance of the MTJ cell, thereby changing the output signal. The data are read by sensing the output signal.

DETAILED DESCRIPTION OF THE PREFERRED EMBODIMENTS

A magnetic random access memory (MRAM) and a method for fabricating the same are now described in detail with reference to the accompanying drawings.

Figure 1:
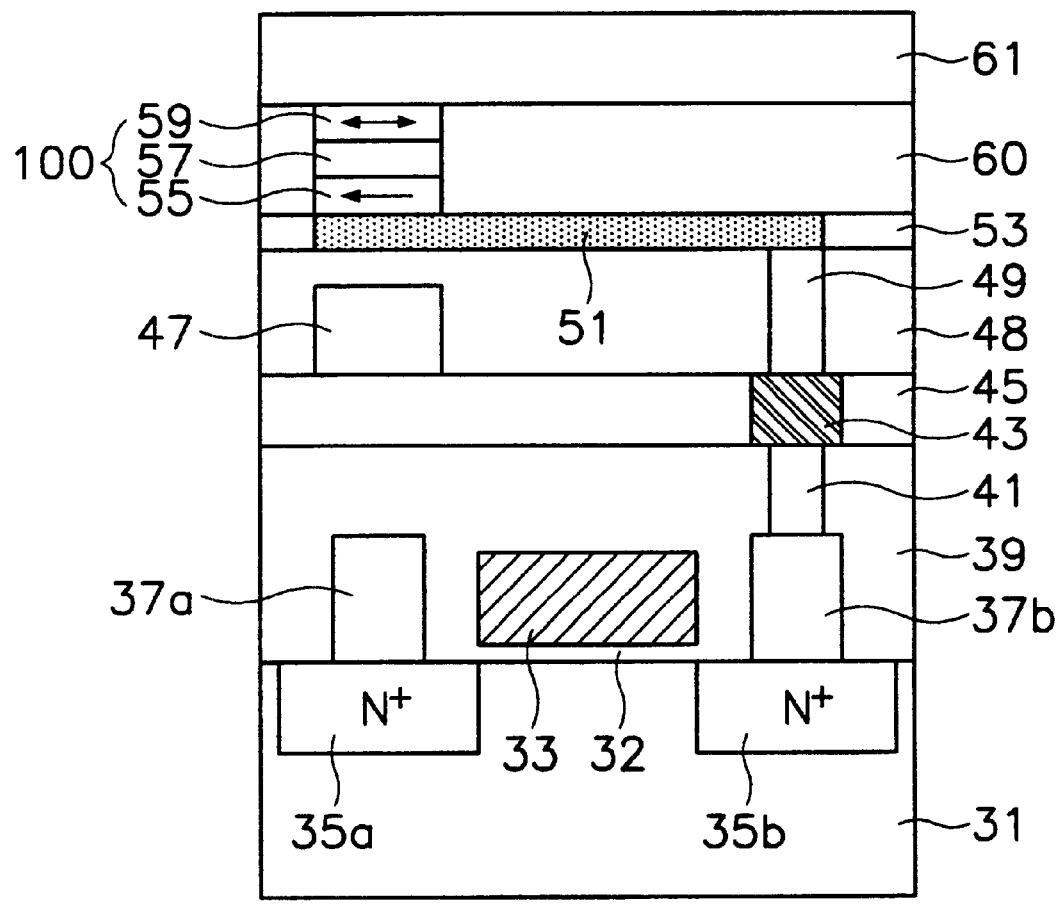
FIG. 1 is a cross-sectional diagram illustrating a first example of a conventional MRAM.
Figure 2:
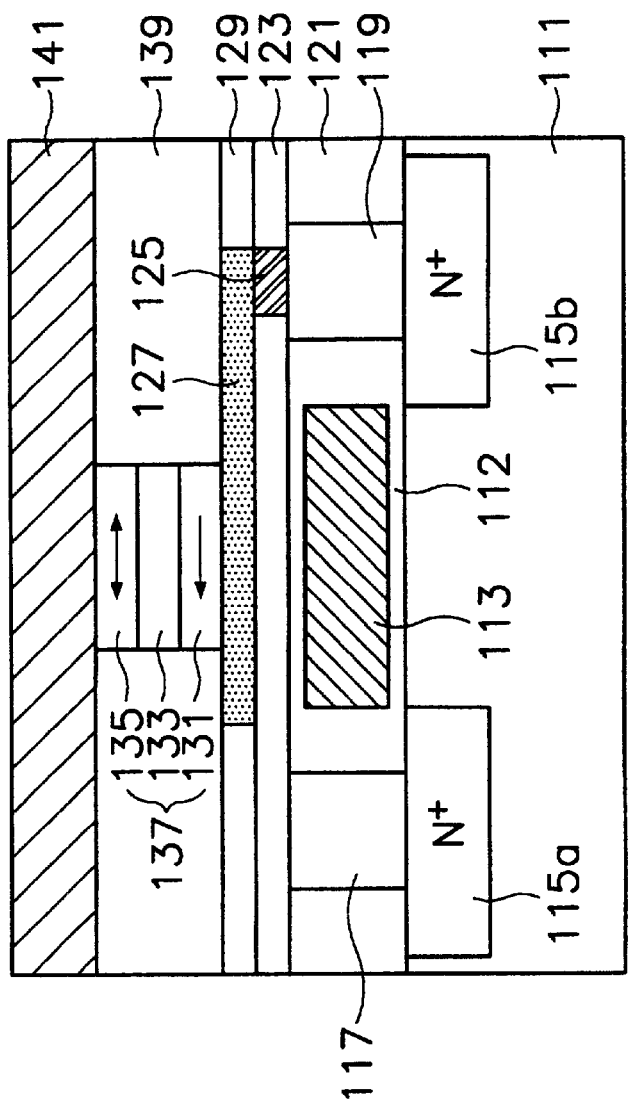
FIG. 2 is a cross-sectional diagram illustrating a second example of the conventional MRAM.
Figure 3:
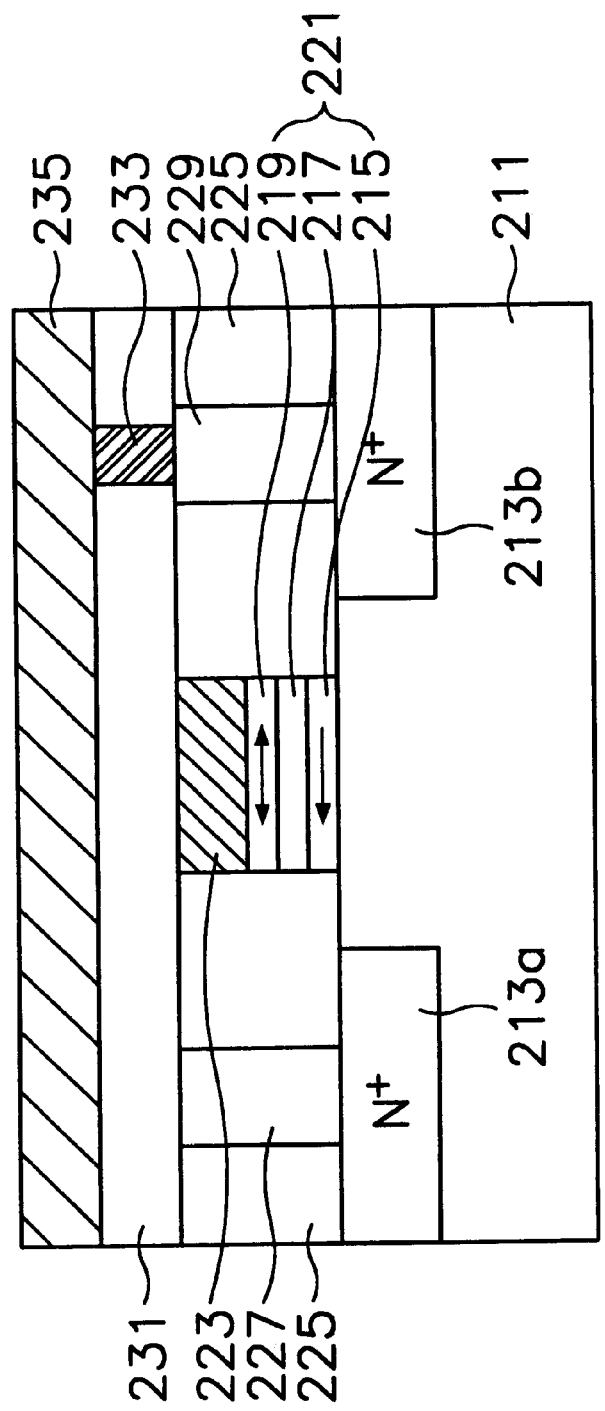
FIG. 3 is a cross-sectional diagram illustrating an MRAM that is disclosed herein.

As depicted in FIG. 3, the MRAM may include a semiconductor substrate 211 serving as a base of a bipolar junction transistor; and an emitter 213a and a collector 213b provided at an active region of the semiconductor substrate 211 according to an impurity implant process. The MRAM may also include a stacked structure of an MTJ cell 221 and a word line 223 positioned at the active region between the emitter 213a and the collector 213b, spaced apart from the emitter 213a and the collector 213b by a predetermined distance; and a bit line 235 contacting the collector 213b and a reference voltage line 227 contacting the emitter 213a. Here, a gate oxide film (not shown) is not formed at the lower portion of the MTJ cell 221 or word line 223.

The emitter 213a and the collector 213b are formed according to the implant process using a mask.

The MTJ cell 221 has a stacked structure of a pinned ferromagnetic layer 215, a tunnel barrier layer 217 and a free ferromagnetic layer 219. At least three multiple data writing states including '0' or '1' can be obtained in one cell of the memory device, by setting up a magnetization direction of the free ferromagnetic layer 219 to have identical or opposite magnetization direction to that of the pinned ferromagnetic layer 215 or to have a predetermined angle.

The bit line 235 is connected to the collector 213b through a connection line 229 and a contact plug 233.

The method for fabricating the MRAM is now described with reference to FIG. 3.

A mask layer (not shown) is formed to expose a predetermined region of the emitter and collector is to be formed at the active region of the semiconductor substrate 211. The emitter 213a and the collector 213b are formed by implanting impurities to the semiconductor substrate 211, and then the mask layer is removed.

The stacked structure of the pinned ferromagnetic layer 215, the tunnel barrier layer 217 and the free ferromagnetic layer 219 are formed over the resultant structure to form an MTJ cell 221.

The MTJ cell 221 of an island type is formed by patterning the stacked structure of the pinned ferromagnetic layer 215, the tunnel barrier layer 217 and the free ferromagnetic layer 219 according to a photolithography process using an MTJ cell mask (not shown).

A conductive layer for a word line is formed over the resultant structure, and patterned to form the word line 223 according to a photolithography process using a word line mask (not shown), thereby forming the stacked structure of the MTJ cell 221 and the word line 223. Here, the word line 223 has a mask insulating film at its upper portion, which improves insulating property.

The stacked structure of the MTJ cell 221 and the word line 223 is formed at the active region between the emitter 213a and the collector 213b, spaced apart from the emitter 213a and the collector 213b by a predetermined distance.

Thereafter, a first interlayer insulating film 225, which planarizes the upper portion of the resultant structure, is formed. Here, the first interlayer insulating film 225 is planarized to expose the upper portion of the word line 223.

The connection line 229 and the reference voltage line 227 are formed to contact the emitter 213a and the collector 213b, respectively, through the first interlayer insulating film 225.

A second interlayer insulating film 231 is formed over the resultant structure, and evenly etched to planarize the upper surface thereof.

A bit line contact plug 233 is formed to contact the connection line 229 through the second interlayer insulating film 231.

Here, the connection line 229 is exposed by etching the second interlayer insulating film 231 according to a photolithography process using a bit line contact mask (not shown), and a conductive layer for a bit line contact plug is deposited to contact the connection line 229, and evenly etched to expose the second interlayer insulating film 231, thereby forming the bit line contact plug 233.

Next the bit line 235 is formed to contact the bit line contact plug 233.

Here, the bit line 235 that contacts the bit line contact plug 233 is formed by depositing a conductive layer for bit line and patterning the conductive layer for bit line.

Still referring to FIG. 3, the operation of the MRAM is now described.

The data write operation is performed by applying current to the word line 223 and the bit line 235 regardless of the transistor.

When the current is applied to the word line 223, the current does not flow toward the transistor due to resistance elements of the tunnel barrier layer 217 formed between the pinned ferromagnetic layer 215 and the free ferromagnetic layer 219 in the MTJ cell 221, but flows toward the word line 223.

The current applied to the bit line 235 does not flow from the collector of the bipolar junction transistor to the base or emitter thereof, but flows through the bit line itself.

Controlling the amount and direction of the current in the word line 223 and the bit line 235 crossing each other in a vertical direction or at a predetermined angle allows setting the magnetization direction of the free ferromagnetic layer 219 of the MTJ cell in a desired direction, and to execute the data write operation.

After the data write operation, the magnetization direction of the free ferromagnetic layer 219 of the MTJ cell 221 is set to be identical or opposite to the magnetization direction of the pinned ferromagnetic layer 215, or to have a predetermined angle.

The MTJ resistance is varied according to the angle of the free ferromagnetic layer 219 and the pinned ferromagnetic layer 215, which is used to perform the data write operation.

During the data read operation, a voltage is applied to the bit line 235 and the word line 223. At this time, the current does not flow in the bit line 235 and the word line 223.

When the current flows through the MTJ cell 221 due to the voltage applied to the word line 223, a voltage drop appears due to the resistance of the MTJ cell 221, so that the voltage applied to the input terminal of the transistor, namely the semiconductor substrate 211 can be varied according to the resistance value of the MTJ cell 221.

When the voltage and current applied to the input terminal are varied, a signal at the output terminal, i.e., the collector 213b, or, if the emitter 213a is used as the output terminal, the signal at the emitter is changed. The reading of the information is possible by sensing the bit line connected to the output terminal of the transistor.

In another aspect, any kind of magneto-resistance devices having a resistance value varied due to magnetization or magnetism, such as, for example, the AMR, GMR, spin valve, ferromagnetic substance/metal semiconductor hybrid structure, III–V group magnetic semiconductor composite structure, metal(semi-metal)/semiconductor composite structure, and colossal magneto-resistance (CMR) can be used instead of the MTJ cell 221. In addition, a phase transformation device having a resistance value varied according to material phase transformation due to an electric signal can be employed.

In still another aspect, the MTJ cell 221 is not directly inserted into the transistor, but electrically connected thereto.

Moreover, the disclosed device can be applied to a vertical bipolar junction transistor as well as the horizontal bipolar junction transistor of FIG. 3, regardless of the structure of the transistor. The disclosed device can also be applied to a heterojunction bipolar transistor (HBT) using III–V group elements such as GaAs.

An insulating film spacer can be formed at side walls of the MTJ cell 221 and the word line 223 to improve an insulating property.

The reference voltage line 227 can be formed as shown in FIG. 3, or formed at the lower portion of the transistor.

In addition, the disclosed device can be applied to a magnetic field sensing device such as a magnetic hard disk head and a magnetic sensor.

As discussed earlier, the general constitution of the MRAM cell is simplified to form the MTJ cell as the input terminal of the bipolar junction transistor. As a result, the entire process is simplified to improve productivity, properties and reliability of the device.

Disclosed herein is a magnetic random access memory (MRAM) and a method for fabricating the same. The method can improve productivity and properties of the device, by simplifying a structure and fabrication process to easily perform a contact process of a bit line, by forming an MTJ cell between a semiconductor substrate and a word line without using a gate oxide film.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A magnetic random access memory (MRAM), comprising:
    a semiconductor substrate;
    a bit line;
    a word line;
    a magnetic tunnel junction (MTJ) cell sandwiched between the word line and the semiconductor substrate; and
    a bipolar junction transistor.

2. The MRAM according to claim 1, wherein a magnetic tunnel junction (MTJ) cell is inserted between the word line and the semiconductor substrate as a magneto-resistance device.

3. The MRAM according to claim 1, wherein the MTJ cell is connected as an input terminal of the bipolar junction transistor.

4. A magnetic random access memory (MRAM) comprising:
    a semiconductor substrate serving as a base of a bipolar junction transistor;
    an emitter and a collector of the bipolar junction transistor provided at an active region of the semiconductor substrate;
    a magnetic tunnel junction (MTJ) cell positioned at the active region between the emitter and the collector and spaced from the emitter and the collector by a predetermined distance;
    a word line provided on the MTJ cell;
    a bit line contacting the collector; and
    a reference voltage line contacting the emitter.

5. The MRAM according to claim 4, wherein the MTJ cell has a stacked structure of a free ferromagnetic layer, a tunnel barrier layer and a pinned ferromagnetic layer.

6. The MRAM according to claim 4, wherein the bit line is contacted through a connection line contacting the collector region and a bit line contact plug.

7. The MRAM according to claim 4, wherein an insulating film spacer is formed at side walls of the word line.

* * * * *

UNITED STATES PATENT AND TRADEMARK OFFICE
CERTIFICATE OF CORRECTION

PATENT NO. : 6,657,270 B2  Page 1 of 1
DATED : December 2, 2003
INVENTOR(S) : Chang Shuk Kim et al.

It is certified that error appears in the above-identified patent and that said Letters Patent is hereby corrected as shown below:

<u>Title page, Item [54] and Column 1, lines 1-4,</u>
Title, please delete "MAGNETIC RANDOM ACCESS MEMORY USING BIPOLAR JUNCTION TRANSISTOR, AND METHOD FOR FABRICATING THE SAME" and replace with -- MAGNETIC RANDOM ACCESS MEMORY USING BIPOLAR TRANSISTOR --.

Signed and Sealed this

Twenty-third Day of March, 2004

JON W. DUDAS
*Acting Director of the United States Patent and Trademark Office*